United States Patent [19]
Pike

[11] Patent Number: 6,100,505
[45] Date of Patent: Aug. 8, 2000

[54] HOTPLATE OFFSET RING

[75] Inventor: Christopher L. Pike, Fremont, Calif.

[73] Assignee: Advanced Micro Devices, Inc., Sunnyvale, Calif.

[21] Appl. No.: 09/320,684

[22] Filed: May 27, 1999

[51] Int. Cl.[7] .............................. H05B 3/68; C23C 16/00
[52] U.S. Cl. .......................... 219/444.1; 118/725
[58] Field of Search .................. 219/444.1, 465.1, 219/466.1, 467.1; 118/715, 724, 725, 726, 727, 728

[56] References Cited

U.S. PATENT DOCUMENTS

| | | | |
|---|---|---|---|
| 5,434,090 | 7/1995 | Chiou et al. | 118/725 |
| 5,474,612 | 12/1995 | Sato et al. | 118/725 |
| 5,583,736 | 12/1996 | Anderson et al. | 361/234 |
| 5,756,964 | 5/1998 | Hsu et al. | 219/392 |
| 5,938,850 | 8/1999 | Arami et al. | 118/725 |

*Primary Examiner*—Sang Paik
*Attorney, Agent, or Firm*—Davis Chin

[57] ABSTRACT

There is provided a hotplate offset ring of a unique construction for use in a heat treatment unit of wafer track system so as to achieve a more uniform heat transfer. In a preferred embodiment, this is achieved by a plurality of spacer tabs formed on the offset ring which prevent the possibility of non-uniformities in a gap formed between the wafer and the hotplate by eliminating any raised surfaces.

8 Claims, 2 Drawing Sheets

HOTPLATE OFFSET RING

BACKGROUND OF THE INVENTION

This invention relates generally to wafer handling equipment and more particularly, it relates to a hotplate offset ring of a unique construction for use in a heat treatment unit of wafer track system so as to achieve a more uniform heat transfer.

As is generally known in the art, a series of processes are required to be performed during the manufacturing of a semiconductor device. One such process is referred to as a "photolithographic or resist process" in which a resist coating is applied to a wafer, the wafer is then exposed, and thereafter the wafer is developed. There are several known types of systems which are commercially available for performing the resist coating/developing processing on a semiconductor wafer. For example, in industrial semiconductor fabrication facilities, there are used normally automated photoresist processing systems sometimes called a "wafer track systems."

Typically, the wafer track system includes a loader station for loading and unloading cassettes containing wafers to be processed, a resist coating station for applying a coat of resist, a heat treatment station and a developing station for developing the exposed wafer and rinsing the developed circuit pattern. The heat treatment station includes a hot plate unit and/or a cool plate unit for controlling the wafer to be at a predetermined temperature.

In the heat treatment station, the wafer is placed on the hotplate in order to undergo conduction baking so as to bake off fluids, such as, for example, solvents used in applying the photoresist to the wafer or liquids used in washing or cleaning the wafer. It is generally desirable that the hotplate used in the baking operation be able to control closely the wafer temperature at every point within the heating cycle. This is achieved currently through heating the wafer by a proximity baking technique in which the amount of heat transferred to the wafer and the rate at which the heat is transferred to the wafer is determined by a controlled gap positioned between the wafer and the hotplate.

At present, this controlled gap is maintained by an offset washer for controlling the gap spacing between the wafer and the surface of the hotplate and screws for holding securely the offset washer to the hotplate. In order to insure uniform heat transfer from the hotplate to the wafer, the wafer must be positioned accurately in the center of the hotplate of the heat treatment unit. In other words, accurate centering of the wafer with respect to the center of the hotplate is critical so that the wafer will rest upon the washer and not on the screws for holding the washer.

Thus, it can be seen that this close proximity baking technique requires the use of a wafer gripper mechanism of some type to perform an accurate and consistent placement of the wafer onto the hotplate so as to prevent the wafer from resting unintentionally on the screwhead. If the wafer indeed becomes off-centered with respect to the hotplate so that it does rest upon the screwhead, then there will be a non-uniform heat transfer which may adversely affect a change of the line width of the circuit pattern of the photoresist in a localized region of the wafer. Further, the non-uniform heating may also result in the non-uniform thickness of the photoresist across the surface of the wafer which will lead to a line width variation after exposure of the resist.

As a result, there exist a need for a way of controlling the gap between the wafer and the surface of the hotplate so as to achieve a more uniform heat transfer. This is perform in the instant invention by the provision of an offset ring of a novel construction for use in a heat treatment station of a wafer track system so as to prevent the possibility of non-uniformities in a gap formed between the wafer and the hotplate.

SUMMARY OF THE INVENTION

Accordingly, it is a general object of the present invention to provide a hotplate offset ring of a unique construction for use in a heat treatment station of wafer track system so as to achieve a more uniform heat transfer.

It is an object of the present invention to provide a hotplate offset ring which includes means for controlling the gap between the wafer and the surface of the hotplate in a heat treatment unit so as to achieve a more uniform heat transfer.

It is another object of the present invention to provide an offset ring for use in a heat treatment station of a wafer track system so as to prevent the possibility of non-uniformities in a gap formed between the wafer and the hotplate by eliminating any raised surfaces.

It is still another object of the present invention to provide a hotplate offset ring of a more robust design to errors caused by inaccurate centering of the wafer than the conventional existing devices.

In a preferred embodiment of the present invention, there is provided a heat treatment station of a wafer track system which includes means for achieving more uniform heat transfer. A hotplate device is provided with a top surface. A hotplate offset ring is disposed concentrically with the hotplate and is used to support a wafer at a predetermined distance above the top surface of the hotplate device so as to create a constant gap therebetween. The offset ring includes a plurality of tabs extending inwardly from an interior wall thereof and supporting the bottom surface of the wafer adjacent its peripheral edge.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

Figure 1:
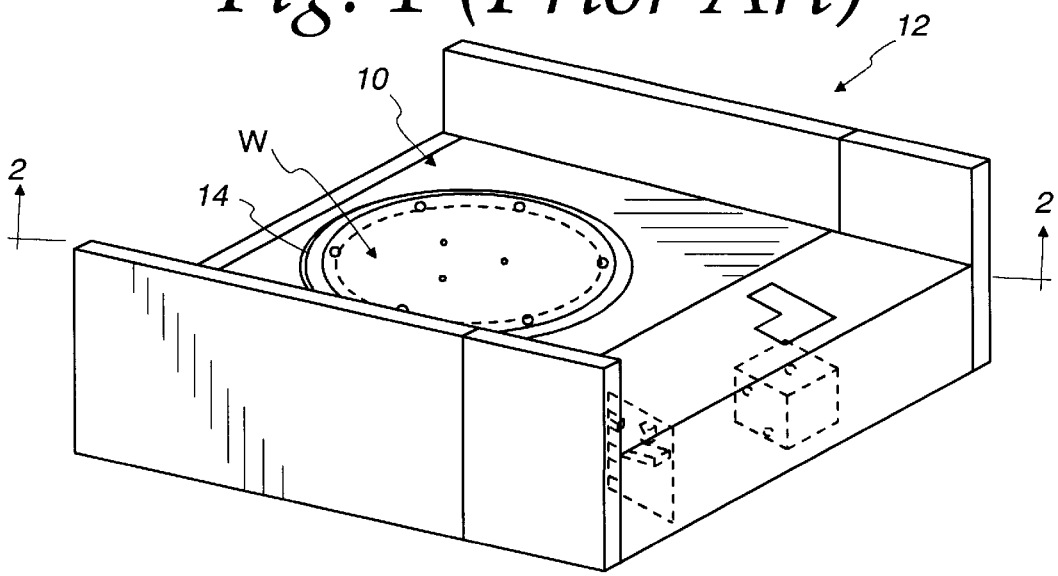
FIG. 1 is a perspective view of a conventional heat treatment unit for a wafer track system, utilizing a standard offset ring for a semiconductor wafer.
Figure 2:
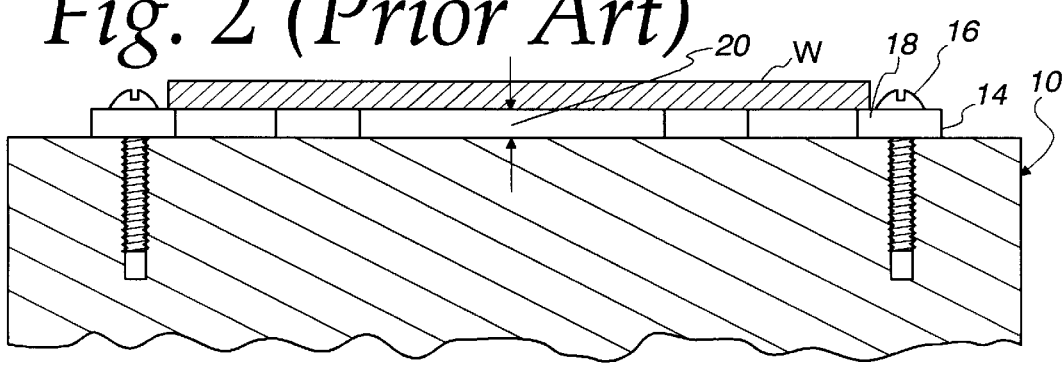
FIG. 2 is a cross-sectional view, taken along the lines 2—2 of FIG. 1.

As was previously pointed out, there are a number of manufacturing operations that are required to be performed during semiconductor wafer processing. One such operation is a resist coat/developing processing which utilizes a hotplate device in a heat treatment station of a wafer track system. Such a conventional hotplate device of a heat treatment station 12 used for heating a wafer W by a proximity baking technique is illustrated in FIGS. 1 and 2. The amount of heat transferred to the wafer and the rate at which the heat is transferred to the wafer during this proximity baking is determined by a controlled gap positioned between the wafer and the hotplate.

As can be seen, the hotplate device 10 has an offset washer 14 disposed on its top surface and is held in a fixed position by a plurality of screws 16. Prior to the heating operation, the wafer W must be accurately centered so as to rest on the inside circumferential edge 18 of the washer 14 by a safer gripper mechanism (not shown). In this manner, the washer 14 serves to provide a constant controlled gap 20 or spacing between the top surface of the hotplate device 10 and the bottom surface of the wafer. As a result, there will be obtained a uniform heat transfer across the wafer.

Figure 3:
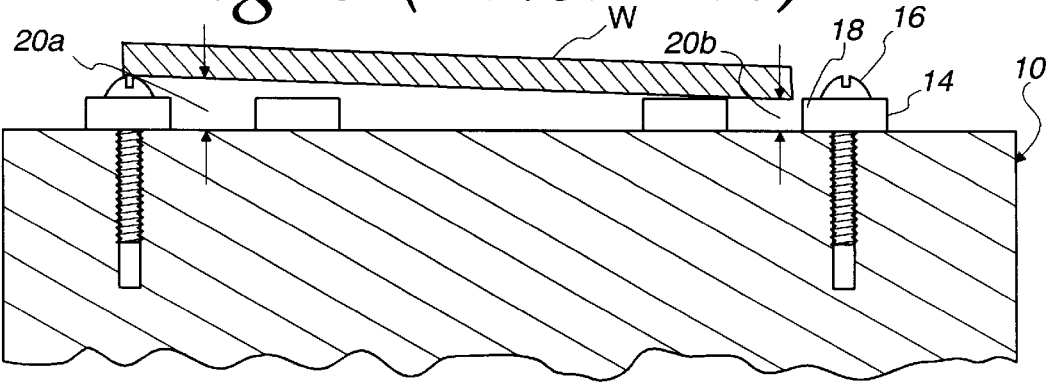
FIG. 3 is a cross-sectional view, similar to FIG. 2 but illustrating the problem of inaccurate centering of the wafer.

However, if the wafer gripper mechanism should cause the wafer to become off-centered so that a part of the wafer W rest unintentionally on the head of the screws 16 then there will be a non-uniform gap formed across the wafer W. As depicted in FIG. 3, the distance or spacing 20a on the left side of the drawing is somewhat larger than the distance 20b on the right side of the drawing. This will cause non-even heat transfer from the hotplate device 10 to the wafer W, thereby significantly varying the line widths of the circuit patterns of the photoresist in a localized region of the wafer. In addition, the non-uniform heat transfer may cause the thickness of the photoresist across the wafer to be non-uniform which will, in turn, vary the line widths of the photoresist after it has been exposed.

Figure 4:
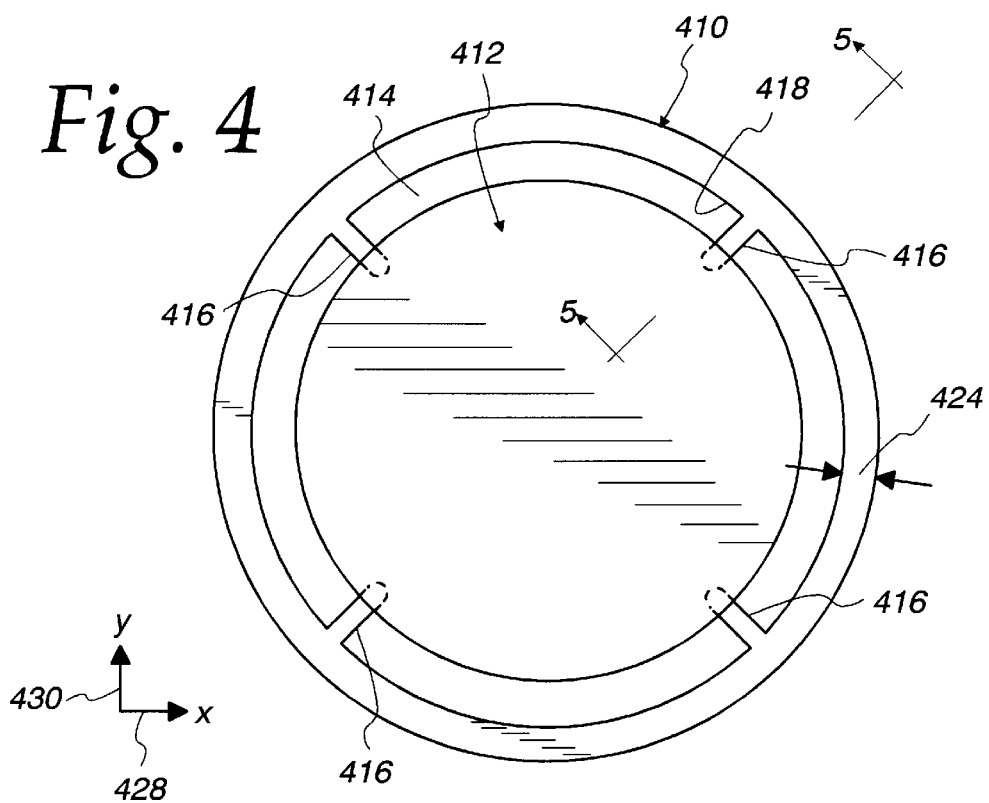
FIG. 4 is a top plan view of a hotplate offset ring, constructed in accordance with the principles of the present invention.
Figure 5:
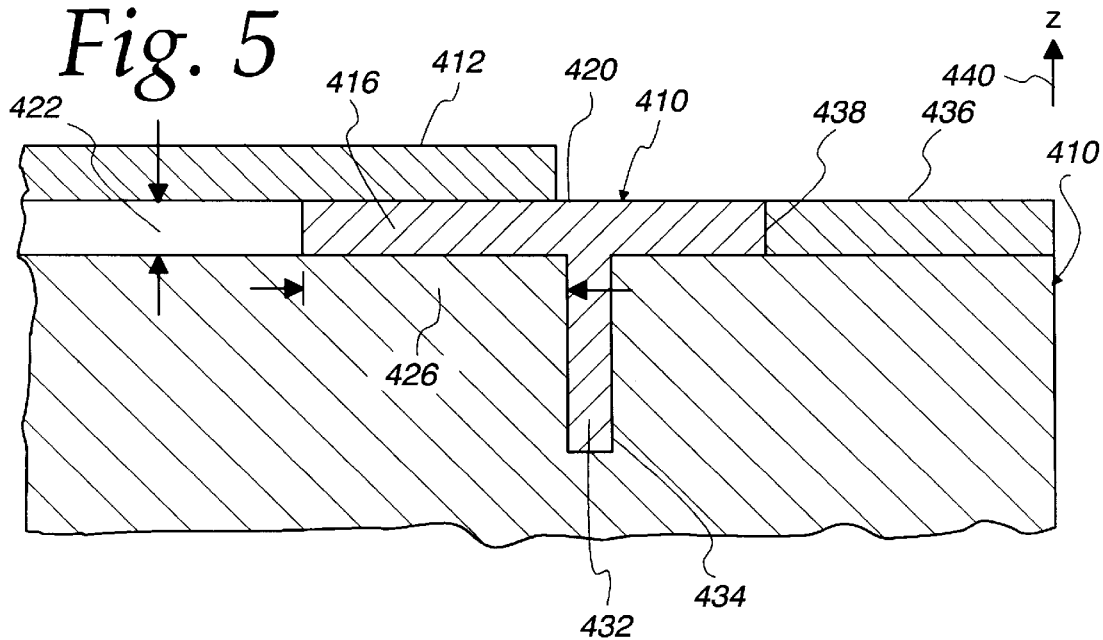
FIG. 5 is a cross-sectional view, taken along the lines 5—5 of FIG. 4.

The purpose of the present invention is to provide an offset ring of a unique construction for in a heat treatment station of a wafer track system so as to achieve more uniform heat transfer. Referring now in detail FIGS. 4 and 5 of the drawings, there is shown a hotplate offset ring 410, constructed in accordance with the principles of the present invention. FIG. 4 is a top plan view of the offset ring 410. FIG. 5 is cross-sectional view, taken along the lines 5—5 of FIG. 4.

The offset ring 410 is of an annular construction and has an inner diameter dimension which is slightly larger than the diameter of the wafer 412. However, the outer diameter of the ring is less than the diameter of the hotplate device 414. A plurality of spacer tabs 416 are formed integrally on the interior circumferential wall 418 of the ring and extend inwardly therefrom a short distance for supporting the wafer. While there are illustrated four (4) such spacer tabs which are equally spaced around the wall 418, it should be appreciated by those skilled in the art that any number, more or less, of tabs may be used as is desired.

As can be best seen from FIG. 5, there are no raised surfaces on the ring 410 since the screws with the raised or protruding head of the prior art in FIG. 2 have been eliminated. Therefore, the wafer 412 will always rest flush on the top surface 420 of the ring so as to provide a constant gap or spacing 422 between the top surface of the hotplate device 414 and the bottom surface of the wafer 412, thereby rendering a uniform heat transfer. The ring 410 is preferably made of a suitable plastic or a ceramic material. In the preferred embodiment, the ring has a width 424 between $\frac{1}{128}$" and $\frac{1}{8}$". Further, the length 426 of the spacer tabs 416 is approximately $\frac{1}{8}$".

In order to prevent lateral movement of the ring 410 in the X and Y directions as shown by the respective arrows 428 and 430 (FIG. 4), an integral post 432 is formed adjacent to each of the spacer tabs 416 and extends downwardly from the bottom surface of the ring. The posts 432 are insertable into the existing screw holes 434 formed in the top surface of the hotplate device 414 so as to secure the ring in a fixed position. Further, a clamping device 436 is applied adjacent to the outer wall 438 of the ring so as to limit its vertical movement in the Z direction as by arrow 440 in FIG. 5.

From the foregoing detailed description, it can thus be seen that the present invention provides a hotplate offset ring of a unique construction for use in a heat treatment unit of wafer track system so as to achieve a more uniform heat transfer. In a preferred embodiment, this is achieved by a plurality of spacer tabs formed on the offset ring which prevent the possibility of non-uniformities in a gap formed between the wafer and the hotplate by eliminating any raised surfaces.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. In a heat treatment station of a wafer track system for achieving more uniform heat transfer, comprising in combination:

a hotplate device having a top surface and a plurality of screw holes formed on the top surface thereof;

a hotplate offset ring disposed concentrically with said hotplate and supporting flushly on its top surface a wafer at a predetermined distance above the top surface of said hotplate device so as to create a constant gap therebetween;

said offset hotplate ring including a plurality of tabs extending inwardly from an interior wall therefrom for supporting the bottom surface of the wafer adjacent its peripheral edge;

means for preventing lateral movement of said ring with respect to the top surface of said hotplate device;

said means for preventing lateral movement being formed of an integral post disposed adjacent to each of said tabs and extending downwardly from the bottom surface of said ring; and said integral post on each of said tabs being insertable into corresponding ones of said plurality of screw holes in the top surface of said hotplate device so as to prevent the lateral movement of said hotplate offset ring.

2. In a heat treatment station as claimed in claim 1, wherein said offset ring is of an annular construction which is made of a plastic.

3. In a heat treatment station as claimed in claim 1, wherein said offset ring is of an annular construction which is made of a ceramic material.

4. In a heat treatment station as claimed in claim 1, wherein said offset ring has a width dimension between $\frac{1}{128}$" and $\frac{1}{8}$".

5. In a heat treatment station as claimed in claim 1, wherein said plurality of tabs is comprised of four equally spaced tabs.

6. In a heat treatment station as claimed in claim 5, wherein each of said plurality of tabs has a length dimension of approximately ⅛".

7. In a heat treatment station as claimed in claim 1, further comprising means for preventing vertical movement of said ring with respect to the top surface of said hotplate device.

8. In a heat treatment station as claimed in claim 7, wherein said means for preventing vertical movement is comprised of a clamp device applied adjacent to the outer wall of said ring.

* * * * *